(12) United States Patent
Morino et al.

(10) Patent No.: US 7,573,710 B2
(45) Date of Patent: Aug. 11, 2009

(54) PORTABLE COMPUTER

(75) Inventors: Takayuki Morino, Yamato (JP);
Hiroaki Agata, Yokohama (JP);
Fusanobu Nakamura, Yamato (JP);
Kazuo Nakada, Sagamihara (JP);
Tomoyuki Takahashi, Fujisawa (JP)

(73) Assignee: Lenovo (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 12/126,010

(22) Filed: May 23, 2008

(65) Prior Publication Data

US 2008/0304231 A1    Dec. 11, 2008

(30) Foreign Application Priority Data

Jun. 11, 2007   (JP) .............................. 2007-153449

(51) Int. Cl.
*H05K 7/20*   (2006.01)
(52) U.S. Cl. .................. 361/679.55; 361/690; 361/694; 361/695
(58) Field of Classification Search ............ 361/679.27, 361/679.55, 690, 695
See application file for complete search history.

(56) References Cited

U.S. PATENT DOCUMENTS

| | | | | |
|---|---|---|---|---|
| 4,949,934 A | * | 8/1990 | Krenz et al. | 361/679.46 |
| 5,163,870 A | * | 11/1992 | Cooper | 454/184 |
| 5,251,096 A | * | 10/1993 | Hosoi et al. | 361/695 |
| 5,646,823 A | * | 7/1997 | Amori | 361/695 |
| 5,796,578 A | * | 8/1998 | Jones | 361/679.55 |
| 5,992,155 A | * | 11/1999 | Kobayashi et al. | 62/3.7 |
| 6,324,055 B1 | * | 11/2001 | Kawabe | 361/679.54 |
| 7,387,209 B2 | * | 6/2008 | Ko et al. | 206/579 |
| 2004/0240164 A1 | * | 12/2004 | Lee | 361/683 |
| 2006/0226040 A1 | * | 10/2006 | Medina | 206/320 |

FOREIGN PATENT DOCUMENTS

| | | |
|---|---|---|
| JP | PUPA62-039098 | 2/1987 |
| JP | 2001-147737 | 5/2001 |

* cited by examiner

*Primary Examiner*—Gregory D Thompson
(74) *Attorney, Agent, or Firm*—Antony P. Ng; Dillon & Yudell LLP

(57) ABSTRACT

A portable computer having a decorative cover is disclosed. The portable computer includes a main housing and a display side housing. The display side housing is openably and closably attached to the main housing. Several apertures for forced air cooling are formed in a bottom and a side of the main housing. The decorative cover is configured to cover surfaces of the display side housing and the main housing. A tray having a flat plate member and a spacer are attached to the bottom of the main housing. The spacer is configured to secure a predetermined space between the flat plate member and the bottom of the main housing to form an air flow passage for allowing outside air to pass through the apertures. The spacer is arranged between the decorative cover and the bottom of the main housing.

9 Claims, 3 Drawing Sheets

PORTABLE COMPUTER

PRIORITY CLAIM

The present application claims benefit of priority under 35 U.S.C. §§ 120, 365 to the previously filed Japanese Patent Application No. JP2007-153449 entitled, "Portable or Mobile-type Computer" with a priority date of Jun. 11, 2007, which is incorporated by reference herein.

BACKGROUND OF THE INVENTION

1. Technical Field

The present invention relates to portable computers in general, and in particular to a portable computer with heat ventilation.

2. Description of Related Art

In a portable computer, such as a notebook computer, a forced air cooling method via a cooling fan is typically employed to cool down the inside of the portable computer. In addition, several fresh air inlets and exhaust outlets are formed on the surface of the portable computer housing for the purpose of ventilation. In order to prevent deterioration in the cooling capability by the forced convective flow, it is necessary that the fresh air inlets and exhaust outlets formed on the housing surface are exposed to outside air.

Users' tastes on popularized notebook computers are becoming diverse from the performance or functions toward the external appearance or portability. In the past, the housing of a notebook computer was made of a light metal, and users could carry it in a bag by accommodating it in another housing formed of a flexible material in order to protect the notebook computer from scratches and/or breakage from accidental drops. However, putting a notebook computer in the housing can be troublesome. For example, when an operating notebook computer is placed on a user's lap, the temperature on the bottom of the housing rises, which may give the user an unpleasant feeling.

It has been considered to cover the external side of the housing with a decorative cover formed of artificial leather or natural leather. The decorative cover for such a purpose is fixed at the housing of the notebook computer to form a portion of the housing and is carried or used integral with the housing. In addition to its good appearance, the decorative cover protects the housing from scratches and absorbs any impacts from accidental drops. In addition, by employing the decorative cover substantially permanently attached to the housing, it is possible to simplify a housing surface finishing process. Thus, the decorative cover provides many advantages.

However, when the decorative cover covers the entire housing of a notebook computer, the fresh air inlets and exhaust outlets for forced cooling may be blocked, thereby deteriorating the capability of a cooling system. Although apertures may be provided on the decorative cover at various positions corresponding to the fresh air inlets and exhaust outlets, such a change may increase production cost and is not desirable from an aesthetic standpoint.

Consequently, it would be desirable to provide a portable computer capable of performing cooling even when it is provided with a decorative cover.

SUMMARY OF THE INVENTION

In accordance with a preferred embodiment of the present invention, a portable computer includes a main housing and a display side housing. The display side housing is openably and closably attached to the main housing. Several apertures for forced air cooling are formed in a bottom and a side of the main housing. The portable computer also includes a decorative cover for covering surfaces of the display side housing and the main housing. A tray having a flat plate member and a spacer are attached to the bottom of the main housing. The spacer is configured to secure a predetermined space between the flat plate member and the bottom of the main housing to form an air flow passage for allowing outside air to pass through the apertures. The spacer is arranged between the decorative cover and the bottom of the main housing.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1A:
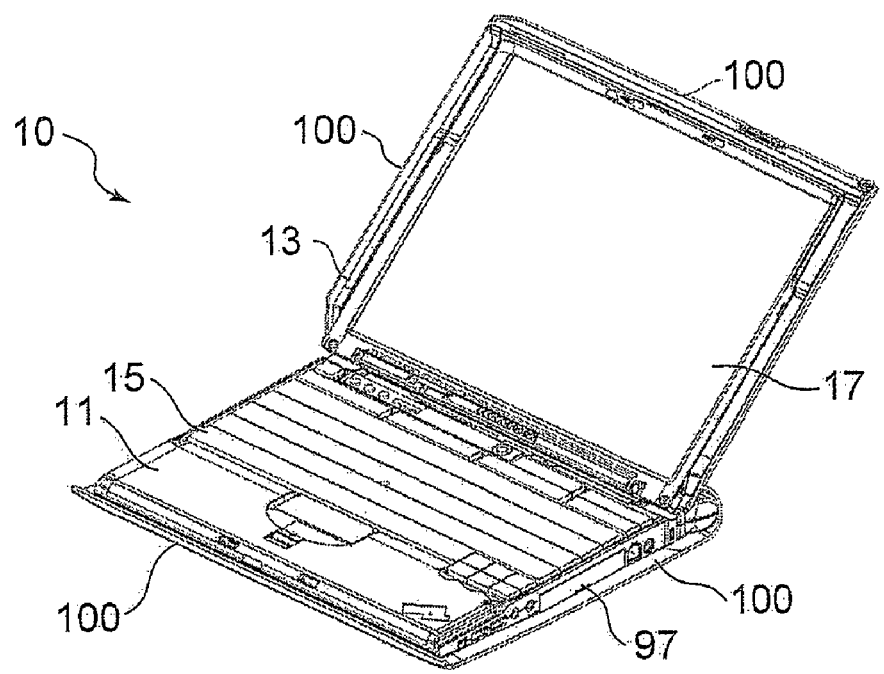
FIGS. 1A and 1B are perspective views of a notebook computer.
Figure 1B:
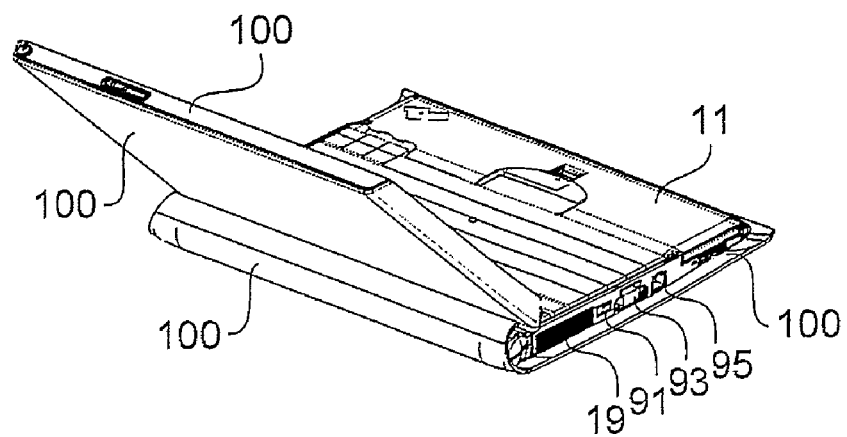

With reference now to the drawings, and in particular to FIGS. 1A and 1B, there are depicted two perspective views of a notebook computer, in accordance with a preferred embodiment of the present invention. FIG. 1A is a perspective view taken from the front side, and FIG. 1B is a perspective view taken from the rear side. The notebook computer 10 includes a main housing 11 that has mounted on a surface thereof a keyboard 15 and that accommodates therein many electronic devices, and a display side housing 13 that has mounted on a surface thereof a liquid crystal display (LCD) 17. The display side housing 13 is openably and closably attached to the main housing 11. A forced air cooling fan is installed inside the main housing 11. An exhaust outlet 19, connectors 91, 93, and 95, and a cover 97 of a disc drive are installed on the sides of the notebook computer 10.

A fresh air inlet for forced air cooling is formed in a bottom of the main housing, which will be described later. The notebook computer 10 is provided with a cooling system that carries out its function in a state where it is constructed by the main housing 11 and the display side housing 13. Heat generated from the inside of the main housing 11 is exhausted by a measurement of air via the fresh air inlet, the fan, and the exhaust outlet.

The notebook computer 10 has mounted thereon a decorative cover 100 that covers the external surfaces of the display side housing 13 and the main housing 11. Since the exhaust outlet 19, the connectors 91, 93, 95, and the cover 97 are present on the sides of the notebook computer 10, the sides are not covered by the decorative cover 100. The decorative cover 100 is constructed to cover the whole external surfaces of the main housing 11 and the display side housing 13, excluding the sides of the main housing 11. The decorative cover 100 can be formed of artificial leather or natural leather. The decorative cover 100 is fixed at the display side housing 13, and is detachably attached to the main housing 11 by a structure described later.

The notebook computer 10 can be opened or closed in a state where the decorative cover 100 is attached thereto. In addition, when using the notebook computer 100, a user opens and powers on the notebook computer 100 in a state where the decorative cover 100 is attached thereto and operates the keyboard 15 while looking at an LCD 17 mounted on the display side housing 13. The decorative cover 100 protects the surfaces F of the display side housing 13 and the main housing 11. Thus, a user may carry the notebook computer 10 by putting it in a bag along with documents without putting it in a protective housing or carry the notebook computer 10 by putting it in a caring housing without a shock absorption function. When the notebook computer 10 is used on a user's lap, the temperature on the bottom of the main housing 11 is relatively high. Therefore, if the main housing 11 is directly contacted with the user's lap, the user may experience an unpleasant feeling. However, since the surface temperature of the decorative cover 100 is relatively lower than the surface temperature of the main housing 11, the user does not have to experience such an unpleasant feeling.

Figure 2:
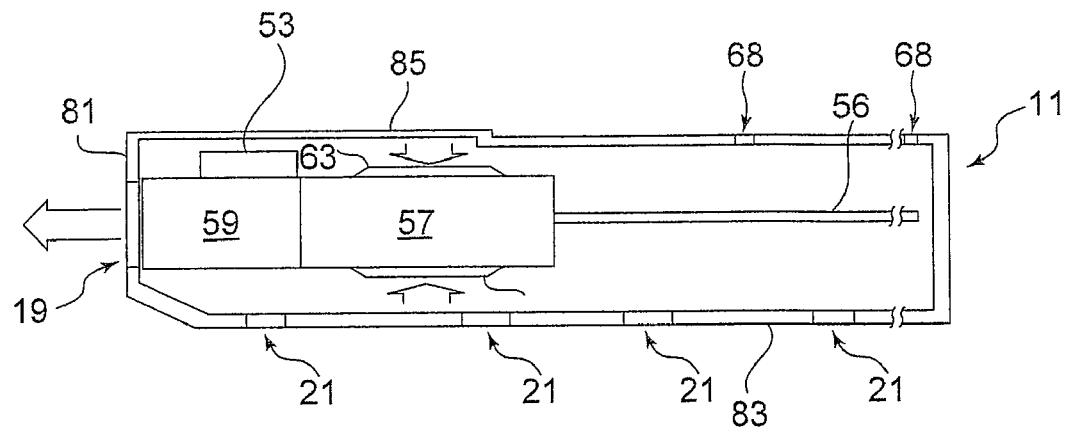
FIG. 2 is a cross-sectional view of a main housing of the notebook computer from FIG. 1.

FIG. 2 is a cross sectional view of the main housing 11 for explaining a forced air cooling system of the notebook computer 10. As shown, the decorative cover 100 is removed from the main housing 11. Inside the main housing 11, a heat sink 59, a fan 57, a heat pipe 53, and a circuit board 56 are arranged. The heat pipe 53 is coupled to a processor (not shown) at one end thereof and to the heat sink 59 at the other end. On the surface of the circuit board 56, many electronic devices (not shown) are mounted. An inhalation portion 63 is installed above the fan 57, and an inhalation portion 65 is installed below the fan 57. The exhaust side of the fan 57 is coupled to the heat sink 59.

The exhaust outlet 19 is formed in a side 81 of the main housing 11, and multiple fresh air inlets 21 are formed in a bottom 83 thereof. Multiple fresh air inlets 68 are formed in a top 85 of the main housing 11. When the fan 57 is turned on, the inside of the main housing 11 is under negative pressure relative to outside air, whereby the outside air flows in through the fresh air inlets 21 and 68 and the electronic devices mounted on the circuit board 56 are cooled.

High-temperature air contacting the electronic devices and low-temperature air not contacting the electronic devices are absorbed into the fan 57 through the inhalation portions 63 and 65 and are exhausted to the outside through the exhaust outlet 19 while cooling the heat sink 59. The heat sink 59 also exhausts heat from the CPU through the heat pipe 53. Therefore, in order for the notebook computer 10 to perform a normal operation while limiting the temperature rise of the main housing 11 within a specified value, it is necessary to prevent the fresh air inlets 21 and 68 and the exhaust outlet 19 from being blocked.

Figure 3:
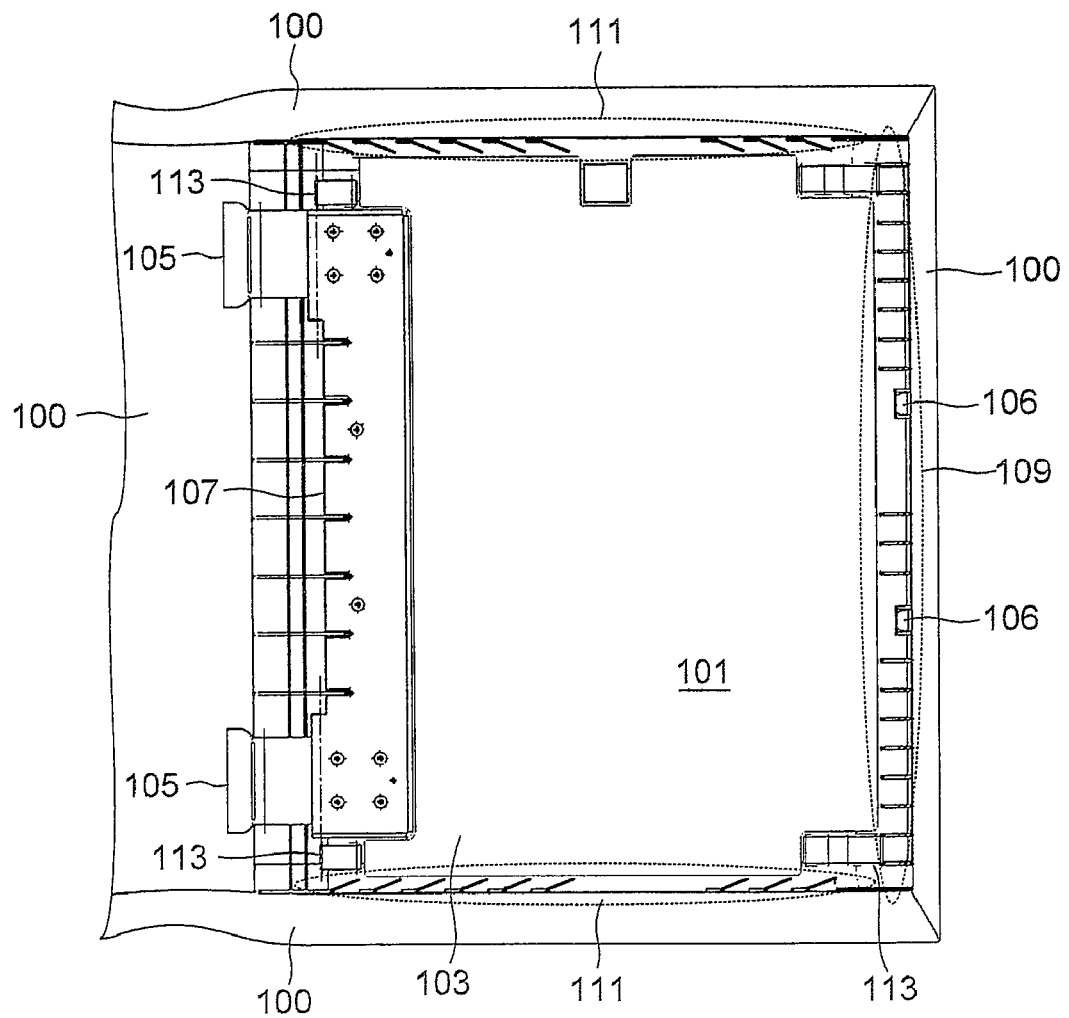
FIG. 3 is a plan view of a decorative cover for covering a bottom of the main housing from FIG. 2.

FIG. 3 is a top plan view of the decorative cover 100 for covering the bottom 83 of the main housing 11. A thermal tray 101 formed of rigid plastic is disposed on the substantially entire area of the inner surface of the decorative cover 100 and is fixed at the inner surface. A flat plate member 103 of the thermal tray 101 has attached thereto leaf springs 105 for detachably coupling the thermal tray 101 to the bottom 83 of the main housing 11 and a spring cover 107 for fixing the leaf springs 105 to the flat plate member 103. Around the flat plate member 103, multiple spacers 109 and 111 for supporting the bottom 83 of the main housing 11 in a state where the notebook computer 10 is opened and used by a user, and leg receiving portions 113 for receiving four rubber legs mounted on the bottom 83 are provided.

A portion of the decorative cover 100 covering the display side housing 13 is fixed at the display side housing 13. When the leaf springs 105 are fitted to fitting portions formed in the bottom 83 of the main housing 11 by a spring action, and notches 106 are fitted to fitting portions formed in the bottom 83, a portion of the decorative cover 100 corresponding to the bottom 83 is detachably fixed to the main housing 11 via the thermal tray 101.

The portion of the decorative cover 100 covering the bottom 83 can be separated by a user from the bottom 83 by using the leaf springs 105 and the notches 106. This is to allow access to a battery pack or a memory slot disposed in the bottom 83 of the main housing 11. However, since the portion of the decorative cover 100 covering the display side housing 13 and the portion of the decorative cover 100 covering the main housing 11 are integrated with each other via a hinge portion, the user cannot separate the decorative cover 100 completely from the display side housing 13.

The spacers 109 and 111 are formed of the same material to have a thin plate shape and are integrally formed with the flat plate member 103. The spacers 109 and 111 are disposed with a gap between them and support a peripheral portion of the main housing 11 having a high rigidity to pressing force. The spacers 109 and 111 support the bottom 83 of the main housing 11 to ensure a predetermined gap between the flat plate member 103 and the bottom 83, whereby an air flow passage of the outside air from around the bottom 83 to the fresh air inlet 21 is secured. The spacers 111 are arranged in a louver shape at an angle of about 60 degrees to 70 degrees with respect to the edges of the bottom 83 or the decorative cover 100.

With this arrangement, since the walls of the spacers 111 appear to be arranged in line when seen from the side of the notebook computer 10, the gap between the bottom 83 and the flat plate member 103 formed by the spacers 111 is made difficult to be seen, and it is possible to prevent foreign materials from entering the gap. Although the spacers 109 are vertical to the edges of the decorative cover 100, this is because as shown in FIG. 1A, the front side of the decorative cover 100 can be formed to conceal the gap between the bottom 83 and the flat plate member 103 of the thermal tray 101. Therefore, the spacer 109 may also be arranged in a louver shape.

Figure 4:
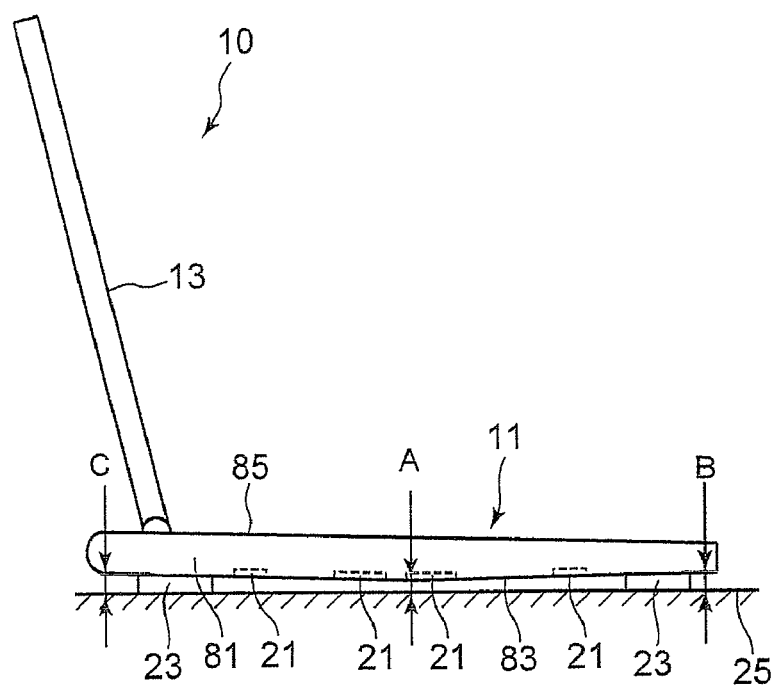
FIG. 4 is a side view of a notebook computer on which a decorative cover is not mounted.

FIG. 4 is a side view of the notebook computer 10 on which the decorative cover 100 is not mounted. The main housing 11 is shaped such that the thickness decreases as it goes from the center toward the front surface. When the notebook computer 10 is used by being placed on a table, the central portion of the main housing 11 is closest to a table surface 25 while a top 85 of the main housing 11 is shaped such that it is inclined downward as it goes from the display side housing 13 toward the front surface. The gap between the bottom 83 of the main housing 11 and the table surface 25 is about 0.7 mm at a position near the central portion as indicated by dimension A, while the gap is about 4 mm to about 5 mm at positions near the front surface and the rear surface as indicated by dimensions B and C, respectively.

Some of the fresh air inlets 21 are present near the central portion where the gap between the bottom 83 and the table surface 25 is the smallest, and the rubber legs 23 are attached to the four corners of the bottom 83. When the notebook computer 10 is used by being placed on a table, the gap between the bottom 83 of the main housing 11 and the table surface 25 is maintained by the rubber legs 23, whereby inhalation through the fresh air inlets 21 is secured.

Figure 5:
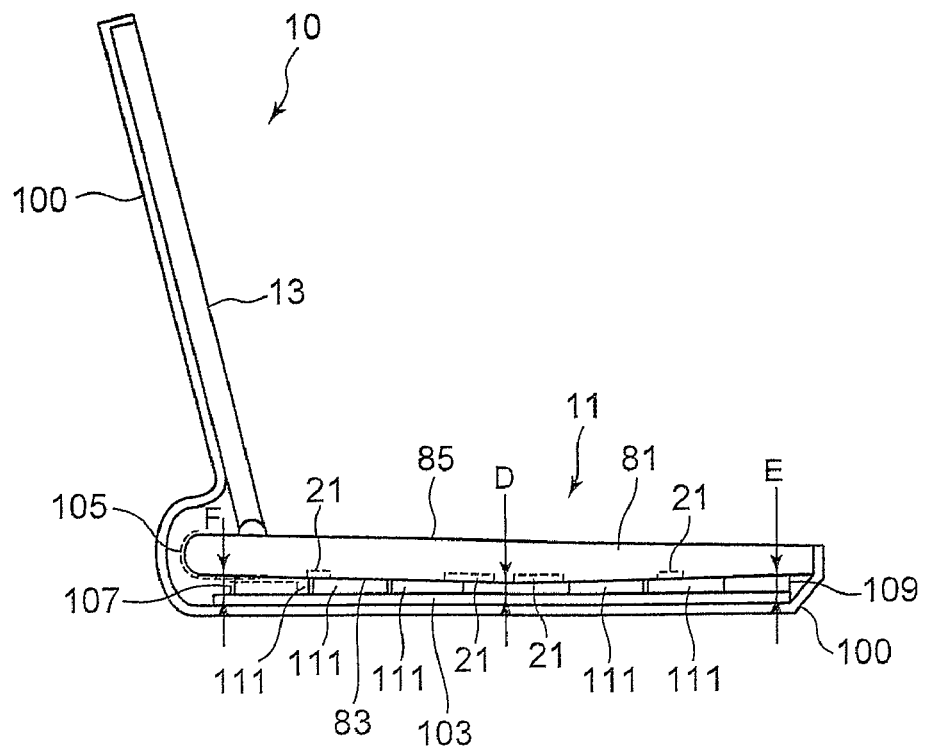
FIG. 5 is a side view of a notebook computer on which a decorative cover is mounted.

FIG. 5 is a side view of the notebook computer 10 on which the decorative cover 100 is mounted. When the bottom 83 is covered by the decorative cover 100, the gap between the bottom 83 and the flat plate member 103 is maintained by the spacers 109 and 111, whereby an air flow passage from around the bottom 83 to the fresh air inlets 21 is secured. Since the spacers 111 are arranged in a louver shape, air flow passages secured between the spacers 111 are not clearly illustrated in FIG. 5. In addition, although not illustrated in FIG. 5, the rubber legs 23 are placed on the leg receiving portions 113 of the thermal tray 101. Since the bottom 83 is securely supported by the spacers 109 and 111, the rubber legs 23 are not necessarily in contact with the leg receiving portions 113 to support the main housing 11.

The gap between the bottom 83 and the flat plate member 103 varies in a manner substantially similar to the state shown in FIG. 4 such that the height of the spacers 111 decreases as they go from the rear surface toward the central portion. The spacers 111 are not provided near the central portion, and the height of the spacers 109 and 111 is defined such that the height increases as they go from the central portion toward the front surface. By defining the height of the spacers 109 and 111 in such a manner, even when the decorative cover 100 covers the entire area of the bottom 83 of the main housing 11, the bottom 83 is floated from the flat plate member 103 in a manner substantially similar to the state shown in FIG. 4.

The gap between the bottom 83 and the flat plate member 103 is about 0.7 mm at a position near the central portion as indicated by dimension D, while the gap is about 3 mm to about 4 mm at positions near the front surface and the rear surface as indicated by dimensions E and F, respectively. That is, the gap secured between the bottom 83 and the flat plate member 103 at positions near the fresh air inlets 21 is substantially the same as the gap secured between the bottom 83 and the table surface 25 in the state shown in FIG. 4. Therefore, an air flow passage for the outside air to the fresh air inlets 21 is secured. In addition, at position near the front surface or the rear surface, the gap between the bottom 83 and the flat plate member 103 is set smaller than the gap between the bottom 83 and the table surface 25. This implies that a user may get an impression that the notebook computer 10 including the decorative cover 100 is thin.

When comparing the state shown in FIG. 4 with the state shown in FIG. 5, at positions near the fresh air inlets 21, the gap between the bottom 83 and the table surface 25 and the gap between the bottom 83 and the flat plate member 103 are substantially the same; therefore, there is no change in the intake volume through the fresh air inlets 21 between the two states. In addition, in either state of FIGS. 4 and 5, since the air exhaust is performed through the exhaust outlet 19 on the side 81, which is not covered by the decorative cover 100, there is no difference between them.

Temperatures were measured for the electronic devices inside the main housing 11 by continuously operating the notebook computer 10 under the same condition at the states shown in FIGS. 4 and 5, and the measured temperatures at the states were substantially the same. Therefore, it was confirmed that a cooling system having the decorative cover 100 and the thermal tray 101 according to the present embodiment can provide a cooling capability equivalent to the case of not having the decorative cover 100. The surface temperatures of the bottom 83 were measured at the same locations, and the measured temperatures 45° C. (the former case) and 45.5° C. (the latter case) were substantially the same.

In the notebook computer 10 having the decorative cover 100 of FIG. 5, when the surface temperature of the bottom 83 was 45.5° C., the surface temperature of the decorative cover 100 was 39.1° C. This is because the outside air flows on the surface of the flat plate member 103, and therefore, even when the notebook computer 10 is used for a long time, the temperature rise in the flat panel member 103 is suppressed, and because the thermal conductivities of the decorative cover 100 and the flat plate member 103 are low. In the present embodiment, although the fresh air inlets 21 are present on the bottom 83, the cooling system may be constructed such that the fresh air inlets may function as an exhaust outlet.

As has been described, the present invention provides a portable computer capable of performing cooling even when it is provided with a decorative cover.

While the invention has been particularly shown and described with reference to a preferred embodiment, it will be understood by those skilled in the art that various changes in form and detail may be made therein without departing from the spirit and scope of the invention.

What is claimed is:

1. A portable computer comprising:
    a main housing and a display side housing openably and closably attached to said main housing;
    a plurality of apertures for forced air cooling formed in a bottom and at least one aperture formed in a side of said main housing;
    a decorative cover for covering surfaces of said display side housing and said main housing; and
    a tray having a flat plate member and a spacer for securing a predetermined space between said flat plate member and said bottom of said main housing to form an air flow passage for outside air to pass through said apertures, wherein said spacer being arranged between said decorative cover and said bottom of said main housing.

2. The portable computer of claim 1, wherein said apertures formed in said bottom are configured as a fresh air inlet, wherein said at least one aperture formed in said side is configured as an exhaust outlet, wherein said decorative cover is constructed to be open to said side and to cover the entire said bottom.

3. The portable computer of claim 2, when a portion of said decorative cover covering said display side housing is fixed to said display side housing, said portion of said decorative cover covering said bottom and said tray are constructed to be separable from said bottom.

4. The portable computer of claim 2, wherein a plurality of the spacers are arranged around said flat plate member.

5. The portable computer of claim 4, wherein said spacers are arranged in a louver shape at a predetermined angle with respect to the edges around said main housing so that a gap between said bottom and said flat plate member is invisible from outside.

6. The portable computer of claim 1, wherein said decorative cover is formed of artificial leather or natural leather.

7. An electronic device in which apertures for forced air cooling are formed in a housing thereof, said electronic device comprising:
    a decorative cover attached to said housing so as to cover said apertures of said housing;
    a flat plate arranged inside said decorative cover; and
    a spacer for forming an air flow passage for outside air through said apertures between a surface of said housing surface and said flat plate, said spacer being arranged between said flat plate and surface of said housing surface in which said apertures are formed.

8. The electronic device of claim 7, wherein said spacer is fixed to said flat plate.

9. The electronic device of claim 8, wherein said flat plate and said spacer are integrally formed of plastic material.

* * * * *